(12) United States Patent
Gutierrez-Aitken

(10) Patent No.: US 6,177,686 B1
(45) Date of Patent: Jan. 23, 2001

(54) HIGH POWER WAVEGUIDE PHOTODIODE WITH AN ABSORPTION LAYER WITH REDUCED ABSORPTION COEFFICIENT

(75) Inventor: Augusto L. Gutierrez-Aitken, Redondo Beach, CA (US)

(73) Assignee: TRW Inc., Redondo Beach, CA (US)

( * ) Notice: Under 35 U.S.C. 154(b), the term of this patent shall be extended for 0 days.

(21) Appl. No.: 09/338,655

(22) Filed: Jun. 23, 1999

(51) Int. Cl.$^7$ ............... H01L 29/06; H01L 31/072; G02B 6/10
(52) U.S. Cl. ............... 257/22; 257/21; 257/184; 385/132
(58) Field of Search ............... 257/21, 22, 184, 257/186, 436, 464, 465, 432; 385/131, 132

(56) References Cited

U.S. PATENT DOCUMENTS

| | | | |
|---|---|---|---|
| 5,910,012 | * 6/1999 | Takeuchi | 438/31 |
| 5,918,109 | * 6/1999 | Koui | 438/31 |

OTHER PUBLICATIONS

Cox, III, C.H., Analog Fiber–Optic Links With Intrinsic Gain, Microwave Journal, Sep. 1992, pp. 90–99.

Lin, L. Y., et al., Velocity–Matched Distributed Photodetectors with High–Saturation Power and Large Bandwidth, IEEE Photoonics Technology Letters, vol. 8, No. 10, Oct. 1996, pp. 1376–1378.

Williams, A.R., et al., InGaAs/InP Waveguide Photodetector With High Saturation Intensity, Electronics Letters, vol. 28, No. 24, Nov. 19, 1992, pp. 2258–2259.

Hietala, Vincent M., et al., Traveling–Wave Photodetectors for High–Power, Large–Bandwidth Applications, IEEE Transactions on Microwave Theory and Techniques, vol. 43, No. 9, Sep. 1995, pp. 2291–2298.

Williams, Keith J., Effects of High Space–Charge Fields on the Response of Microwave Photodetectors, IEEE Photonics Technology Letters, vol. 6, No. 5, May 1994, pp. 639–641.

Williams, Keith J., Nonlinearities in p–i–n Microwave Photodetectors, Journal of Lightwave Technology, vol. 14, No. 1, Jan. 1996, pp. 84–96.

Sun, Chi–Kuang, et al., Ultrafast Transport Dynamics of p–1–n Photodetectors Under High–Power Illumination, IEEE Photonics Technology Letters, vol. 10, No. 1, Jan. 1998, pp. 135–137.

* cited by examiner

*Primary Examiner*—Minh Loan Tran
(74) *Attorney, Agent, or Firm*—Michael S. Yatsko; Connie M. Thousand

(57) ABSTRACT

A photodiode for an input light signal comprising an absorption layer having an absorption coefficient which is less than the absorption coefficient of InGaAs when measured at a wavelength of 1.55 $\mu$m. First and a second cladding layer are disposed on opposite sides of the absorption layer leaving exposed a side of the absorption layer. Positively and negatively polarized contact layers are disposed on the first and second cladding layers respectively. The input light signal is directed into the exposed side of the absorption layer and the absorption layer absorbs the input light signal and photo-generates therefrom carriers. The contact layers collect the carriers and generate therefrom photocurrent.

24 Claims, 4 Drawing Sheets

HIGH POWER WAVEGUIDE PHOTODIODE WITH AN ABSORPTION LAYER WITH REDUCED ABSORPTION COEFFICIENT

BACKGROUND OF THE INVENTION

This invention relates generally to photodiodes, and more particularly to a photodiode with improved distributed absorption capabilities.

Waveguide photodiodes are used in the digital analog and RF optical links of communication systems to convert optical power into photocurrent. Waveguide photodiodes which operate at high optical power and at a high frequency and do so efficiently within the linear range of the photodiode are critical to a high powered optical link. These high power, high efficiency photodiodes are necessary to provide a communication system which has reduced RF insertion loss, increase signal-to-noise ratio and increased linearity for the communication system.

Referring to FIG. 1, a typical waveguide photodiode 10 includes a light absorption layer 12 sandwiched between a top cladding layer 14 and a bottom cladding layer 16. Light 17 is directed into the absorption layer 12 through one side of the photodiode 10. The cladding layers 14, 16 are configured to guide the light 17 in the photodiode 10 in a preselected optical mode. Two contact layers 18, 20 are positioned on opposite sides of the cladding layers 14, 16 and are positively and negatively polarized, respectively, by a voltage supply (not shown). The light 17 propagates into the absorption layer 12 which absorbs the light 17 and photogenerates carriers therefrom in the form of pairs of positively charged holes and negatively charged electrons. The voltage supply produces an electric field which provides the stimulus to cause the positively charged holes to travel towards the negatively charged contact layer 16, and the negatively charged electrons to travel towards the positively charged contact layer 14. The electric field strength inside the absorption layer 12 of a photodiode 10 determines the speed at which the holes and electrons travel to their respective contact layers, it is therefore very important to maintain a high electric field strength level over the entire length, x, of the photodiode 10 in order to provide an efficient photodiode 10. The contact layers 14,16 collect the electrons and holes that form the photocurrent.

One measure of the performance of a photodiode 10 is the efficiency. Efficiency of a photodiode is a measure of how much of the input light signal is photogenerated into carriers that subsequently form the photocurrent. Other measures of the performance of an RF optical link are the gain and noise figure of the link. High gain and low noise figure are very important to an analog RF optical link of a communications system using the photodiode 10, particularly in those links which have external modulation. The gain of the RF optical link is proportional to the square of the photocurrent and the noise figure is inversely proportional to the photocurrent making both the gain and the noise figure dependant on the efficiency of the photodiode 10. Thus, it is desirable to maximize the efficiency of a photodiode 10 to maximize the gain and minimize the noise figure.

To do so in a typical Indium-Phosphate (InP) photodiode 10 operating in the 1.3–1.55 $\mu$m wavelength range, the absorption layer 12 is formed of an InGaAs material which is lattice-matched to InP. InGaAs is typically used for the absorption layer 12 because of its superior light absorbing properties. The absorption coefficient ($\alpha$) is a measure of the light absorbing capability of a material. For InGaAs, the $\alpha$ is approximately 0.8–1.0 $\mu m^{-1}$ measured at a wavelength of 1.55 $\mu$m.

An absorption layer 12 having a high absorption coefficient such as 0.8–1.0 $\mu m^{-1}$ provides for good absorption of the input light signal 17; however, as shown in FIG. 2, the absorption and generation of photocurrent occurs primarily in the first few micrometers of the photodiode 10 (FIG. 1). This results in a large percentage of the carriers being photo-generated in the first few micrometers ($\mu$m) of the absorption layer 12 which can result in an electric field collapse in the beginning region of the absorption layer 12.

The collapse of the electric field has the undesirable effect of reducing the velocity of the carriers and inhibiting the collection of the carriers by the contact layers 14, 16. In addition, photogenerating a large number of carriers in the beginning region of the photodiode 10 has the undesirable effect of increasing the harmonic frequency generated by the photodiode 10 as well as generating a large amount of heat in the beginning portion of the photodiode 10. This can lead to a thermal failure of a communications link which contains the photodiode 10.

To solve this problem, photodiodes which distribute the absorption of light in a more uniform manner across the length (x) of the photodiode 10 have been developed. One such photodiode is the velocity-matched photodiode 30 shown in FIG. 3. The velocity matched photodiode includes a non-absorbing waveguide core 32 which is sandwiched between two cladding layers 34, 35. Coplanar strips 40 are positioned on top of one of the cladding layers 34. Several interdigitated MSM photodiodes 36 are placed on top of one of the cladding layers 34 and are coupled together through an optical waveguide 38. Additional information on interdigitated MSM photodiodes 36 can be found at "InGaAs Metal-Semiconductor-Metal Photodetectors for Long Wavelength Optical Communications," by J. B. D. Stoole, et al., IEEE J. of Quantum Elec., Vol. 27, No. 3, March 1991.

The cladding layers 34, 35 guide the light 37 in the photodiode 30. Each MSM photodiode 36 contains an absorbing layer and is operative to couple a portion of the light 37 propagating in the photodiode 30 into the absorbing layer within each of the MSM photodiode 36.

The MSM photodiodes 36 generate photocurrent from the coupled light.

Since only a portion of the light 37 is converted into photocurrent by each MSM photodiode 36, the absorption of the light 37 is spread over the length (x) of the photodiode 30. The MSM photodiodes 36 are configured and positioned in preselected locations across the length, x, of the photodiode 30 so as to match the group velocity of the light 37 in the waveguide core 32 with the group velocity of the photocurrent microwave signal in the coplanar strips 40. This matching of velocities is needed for the light absorbed by each MSM photodiode 36 to be added together in phase in the optical waveguide 38. To have high efficiency, a high number of MSM photodiodes is required. This makes the velocity-matched photodiode very long.

In addition, the velocity-matched photodiode 30 can be difficult to fabricate since electron-beam lithography is generally required to pattern the MSM photodiodes 36. It can also be lossy since the velocity-matched photodiode 30 requires an impedance coupled to the MSM photodiodes 36 to terminate the coplanar waveguide 38. This is undesirable since a termination impedance reduces the amount of photocurrent delivered to the next stage in the communications link which is typically an amplifier.

Referring to FIG. 4, another photodiode which distributes the absorption of light 48 in a more uniform manner across the length, x, of the photodiode 50 is an expanded optical mode photodiode 50. Referring to FIGS. 4 & 5, a comparison of a side sectional view of a portion of the typical prior art photodiode 10 of FIG. 1 and a sectional view of a portion of the expanded mode photodiode 50 shows that the expanded optical mode photodiode 50 provides a thinner absorbing layer 52 and thicker cladding layers 54, 55 than that provided by the typical photodiode 10. In the typical photodiode 10, the optical mode 56 occurs mostly in the absorbing layer 12 whereas in the expanded optical mode photodiode 50, the optical mode 58 occurs mostly in the cladding layers 54, 55 which do not absorb light. Thus, a smaller amount of the light 48 is absorbed per unit length, x, in the expanded optical mode photodiode 50 providing for a more uniform absorption of the light 48 across the length, x, of the photodiode 50. This results in the generated heat being more uniformly dissipated across the length, x, of the photodiode 50 and reduces the amount of heat dissipated per unit length in the photodiode 50. However, the expanded optical mode photodiode 50 still provides for high carrier density in the beginning portion of the photodiode 50 (around x=0) which can result in non-linear effects in the response of the photodiode.

What is needed therefore is a photodiode which would reduce the amount of heat dissipated per unit length and also reduce the amount of carriers being photogenerated in the beginning portion of the photodiode while at the same time, providing an efficient photodiode.

SUMMARY OF THE INVENTION

The aforementioned need in the prior art is satisfied by this invention, which provides a photodiode for an input light signal comprising an absorption layer which is fabricated of a preselected material having an absorption coefficient which is less than the absorption coefficient of InGaAs when measured at a wavelength of 1.55 $\mu m^1$. First and second cladding layers are disposed on opposite sides of the absorption layer and first and second contact layers are disposed on the first and second cladding layers respectively. The input light signal enters the absorption layer which absorbs the input light signal and generates therefrom carriers. The contact layers collect the carriers and generate therefrom photocurrent.

In accordance with a one aspect of the invention, the absorption layer is fabricated of a material having a reduced absorption coefficient of less than 0.4 $\mu m^1$.

In accordance with a second aspect of the invention, the absorption layer is fabricated of an InGaAlAs material.

In accordance with a third aspect of the invention, the absorption layer is fabricated of an InGaAsP material.

DETAILED DESCRIPTION OF THE INVENTION

Figure 6:
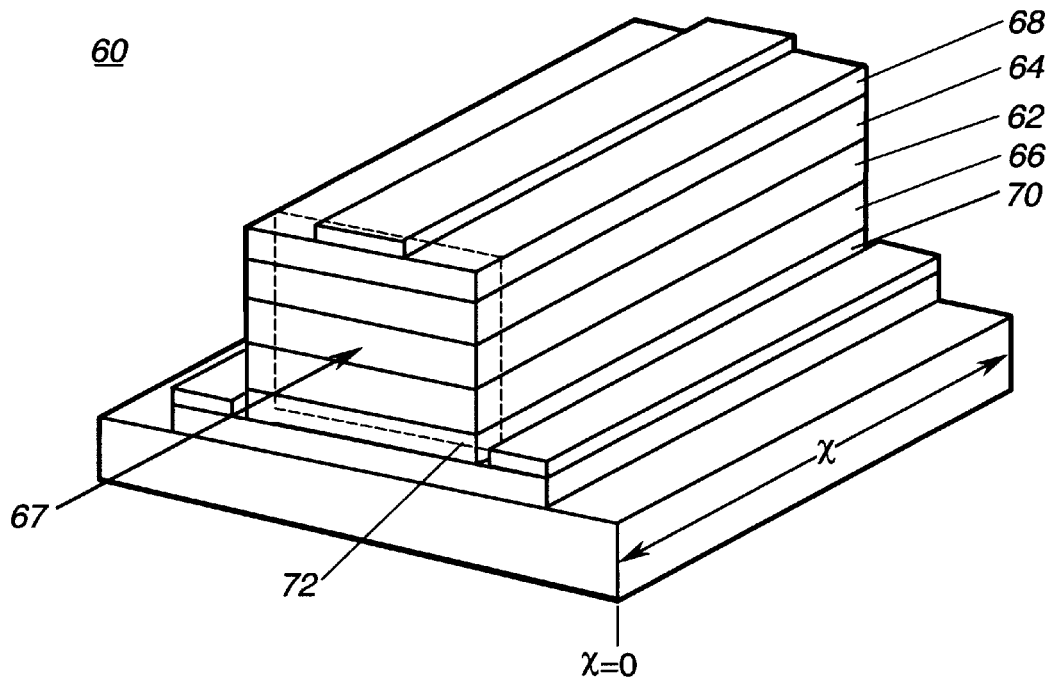
FIG. 6 is an isometric drawing of a reduced absorption coefficient photodiode in accordance with the present invention.

Referring to FIG. 6, the present invention provides a reduced absorption coefficient photodiode 60 which can be used in an optical RF communication link and is particular applicable for high performance RF optical links, RF power generation using optical heterodyning and large dynamic range communications systems. A photodiode 60 in accordance with the present invention includes a light absorption layer 62 which is fabricated of a material having an absorption coefficient which is less than the absorption coefficient of InGaAs.

The absorption layer 62 is sandwiched between a top cladding layer 64 and a bottom cladding layer 66. Light 67 is directed into the absorption layer 62 through one side of the photodiode 60. The cladding layers 64, 66 are configured to guide the light 67 in the photodiode 60 in a preselected optical mode. Two contact layers 68, 70 are positioned on opposite sides of the cladding layers 64, 66 and are positively and negatively polarized respectively. The light 67 propagates into the absorption layer 62 which absorbs the light 67 and photo-generates carriers therefrom in the form of pairs of positively charged holes and negatively charged electrons. The contact layers 64,66 collect the electrons and holes that form the photocurrent therefrom.

Figure 1:
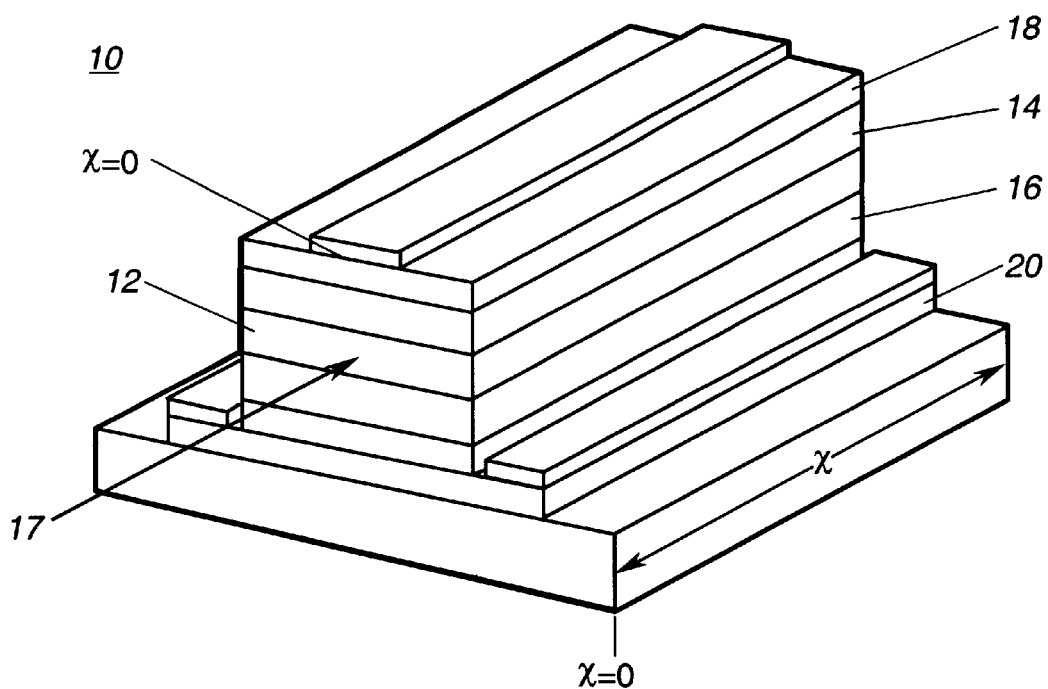
FIG. 1 is an isometric drawing of a typical prior art photodiode.
Figure 2:
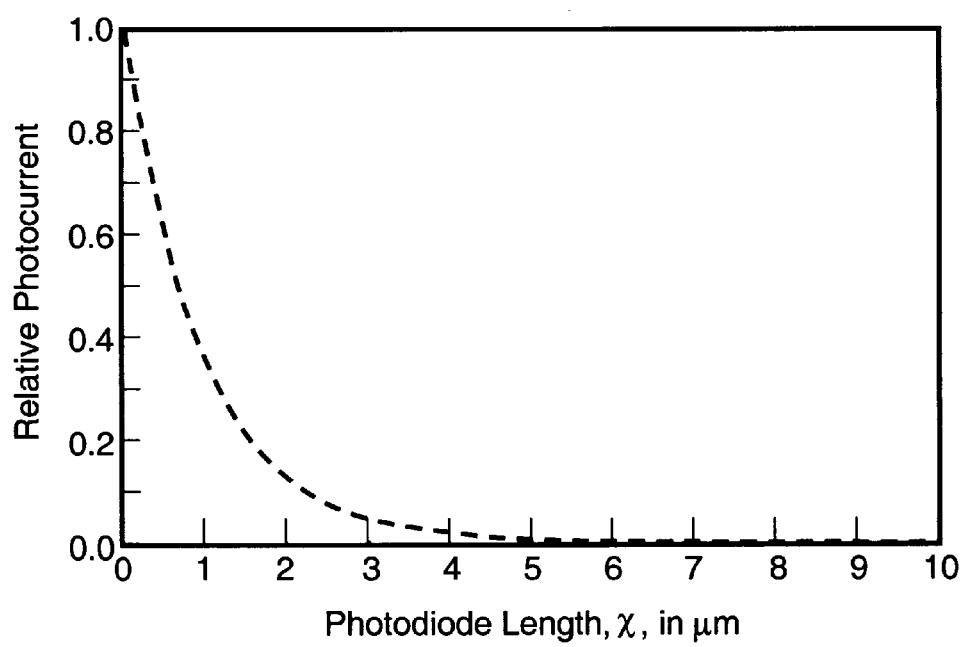
FIG. 2 is a graph of relative photocurrent as a function of absorption region distance for the prior art photodiode of FIG. 1.
Figure 3:
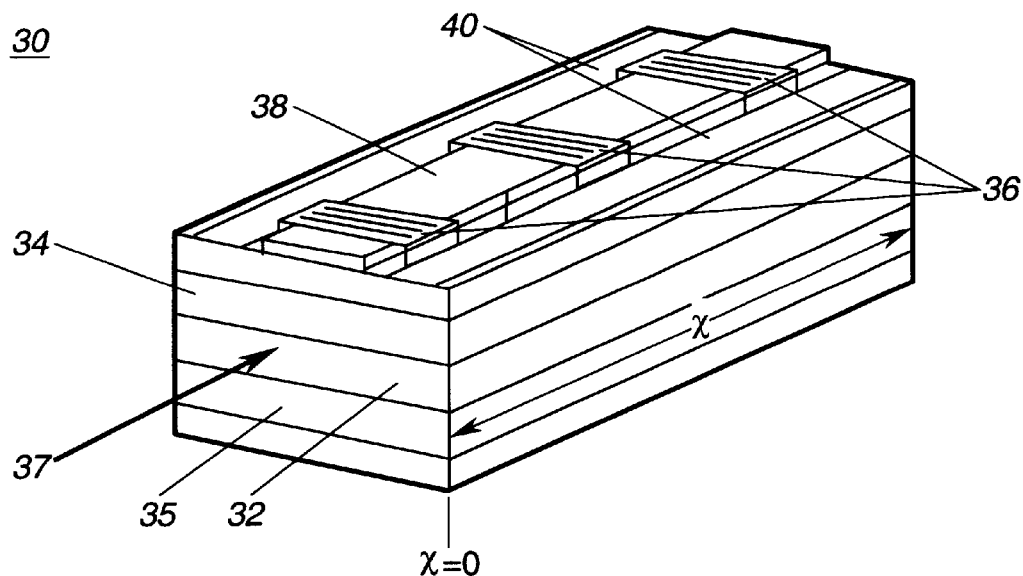
FIG. 3 is a diagram of a prior art velocity matched waveguide photodiode.
Figure 4:
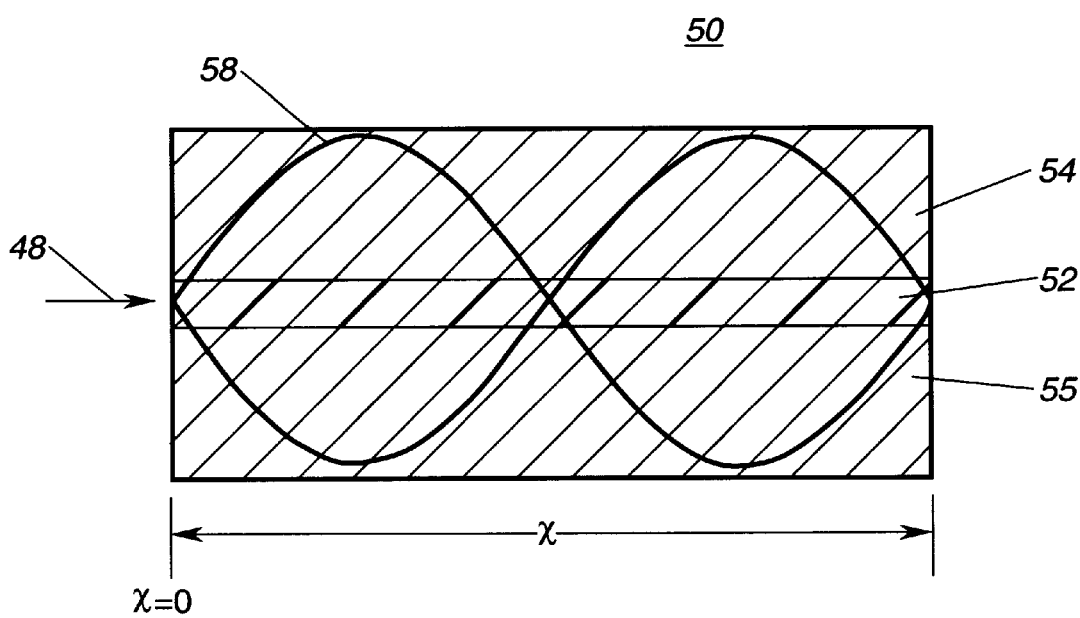
FIG. 4 is a side sectional view of a prior art expanded optical mode photodiode.
Figure 5:
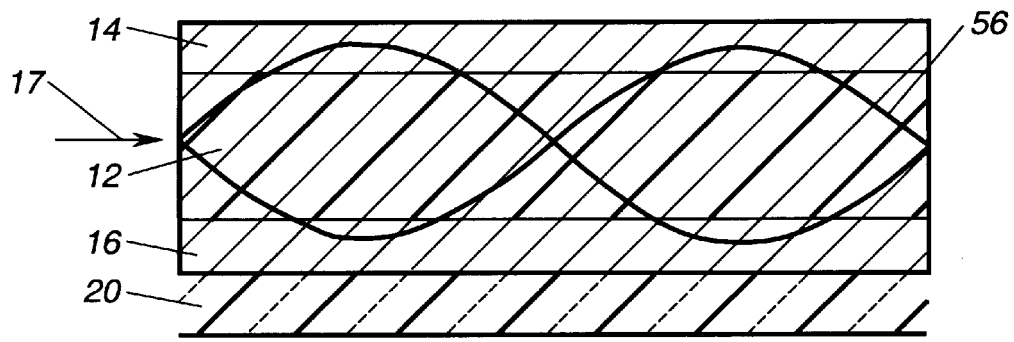
FIG. 5 is a side sectional view of the typical prior art photodiode of FIG. 1.

In accordance with the present invention, the reduced absorption coefficient photodiode 60 distributes the absorption of light 67 in a more uniform manner across the length (x) of the photodiode 60 while reducing the number of carriers which are photo-generated in the beginning region 72 of the photodiode 60 such that less power is dissipated in the beginning region 72 of the photodiode 60 than that dissipated in the beginning region of the prior art photodiode 10 (FIG. 1).

For a typical prior art Indium-Phosphate (InP) photodiode 10 (FIG. 1), the absorption layer 12 is fabricated of an InGaAs material which is lattice matched to InP and has an absorption coefficient of approximately 0.8–1.0 $\mu m^{-1}$ measured at a wavelength of 1.55 $\mu m$. The absorption layer 62 (FIG. 6) of the reduced absorption coefficient photodiode 60 of the present invention is fabricated of a material having a preselected absorption coefficient which is less than the absorption coefficient of InGaAs.

The absorption layer 62 of the photodiode 60 is preferably fabricated of a material having an absorption coefficient which is as low as possible but still provides for good absorption of an input light signal 67. As will be subsequently discussed, the lower the absorption coefficient, the more linear the photogeneration of the carriers across the length of the photodiode 60 and the lower the amount of heat which is dissipated in the beginning region 72 of the photodiode 60.

One material having an absorption coefficient which is less than that of InGaAs and still provides for good absorption of an input light signal 67 is InGaAlAs. Typically, the absorption coefficient of InGaAlAs is between 0.1 and 0.6 $\mu m^{-1}$ depending on the percentage of aluminum in the InGaAlAs material. For the preferred embodiment of the invention, the amount of aluminum is sufficient to provide an absorption coefficient of approximately 0.4 µm. By using an InGaAlAs material for the absorption layer 62, the present invention is in essence adding a preselected amount of an aluminum material to the InGaAs absorption layer 12 (FIG. 1) of a typical prior art InP photodiode 10 which provides an absorption layer 62 having a reduced absorption coefficient when compared to that of the prior art 10.

For the preferred embodiment of the invention, the InGaAlAs material contains between 1% and 5% of aluminum. The higher the percentage of aluminum in the InGaAlAs material, the lower the absorption coefficient of the InGaAlAs absorption layer.

The present invention is not limited to a photodiode 60 having an absorption layer which is fabricated of an InGaAlAs material but can be practiced with any material having an absorption coefficient which is less than the absorption coefficient of InGaAs material and is known to one skilled in the art to absorb an input light signal 67 and facilitate the generation of photocurrent therefrom. For example, the present invention can also be practiced with an InGaAsP material which has an absorption coefficient which is less than that of InGaAs. The exact absorption coefficient of InGaAsP is dependent on the percentages of As and P with respect to the percentages of In and Ga.

Figure 7:
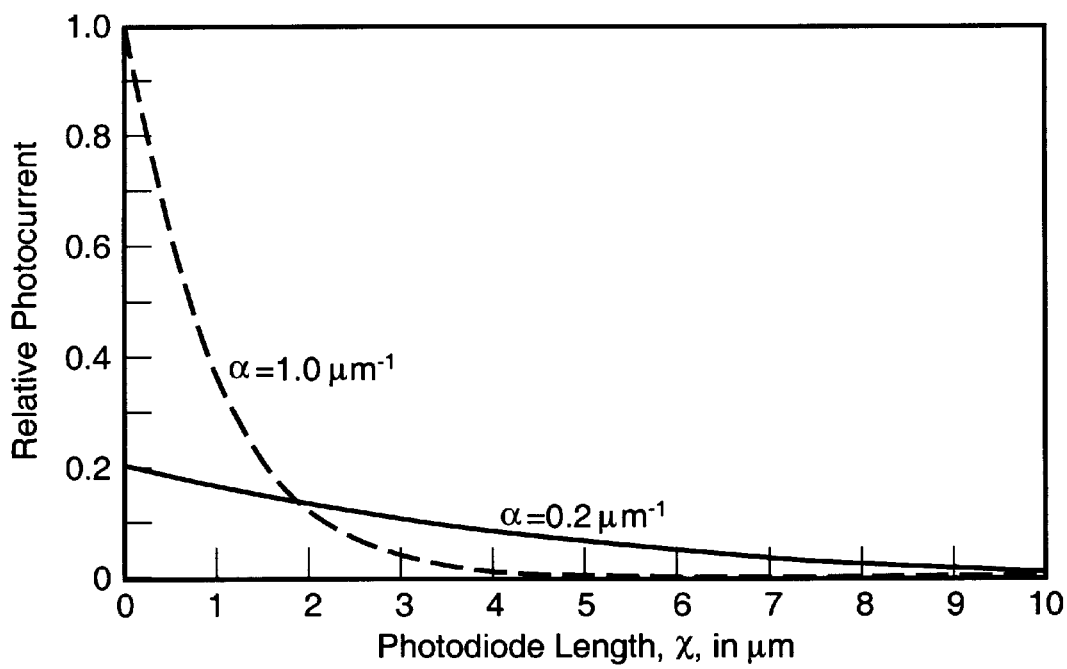
FIG. 7 is a graph of relative photocurrent as a function of absorption layer length for the reduced absorption coefficient photodiode of FIG. 6 as compared to the prior art photodiode of FIG. 1; and, FIG. 8 is a graph of relative dissipated power as a function of absorption layer length for the reduced absorption coefficient photodiode of FIG. 7 as compared to the prior art photodiode of FIG. 1.
Figure 8:
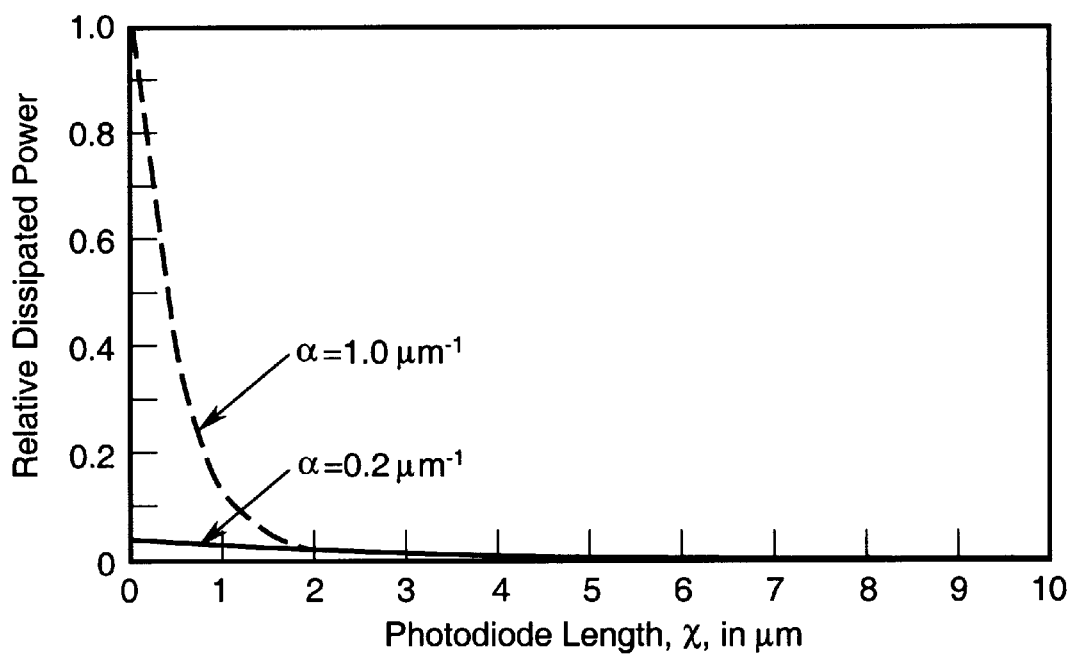

For illustrative purposes, FIGS. 7 and 8 show a graphical comparison of the relative photocurrent and dissipated power as a function of photodiode length for the typical prior art photodiode 10 of FIG. 1 having an absorption layer 12 with absorption coefficient ($\alpha$) of 1.0 $\mu m^{-1}$ and a reduced absorption coefficient photodiode 60 (FIG. 6) having an absorption layer 62 with a reduced absorption coefficient of 0.2 $\mu m^{-1}$. As shown in FIG. 7, for the typical prior art photodiode having an InGaAs absorption layer ($\alpha$=1.0 $\mu m^{-1}$) a large percentage of the light is absorbed in the first 2 to 3 µm of the photodiode. When compared to the typical prior art photodiode ($\alpha$=1.0 $\mu m^{-1}$), a reduced absorption coefficient photodiode having an InGaAlAs absorption layer which contains enough Al to provide an absorption layer which has absorption coefficient of 0.2 ($\mu$=0.2 $\mu m^{-1}$) in accordance with the present invention has a more uniform absorption profile over the length, x, of the photodiode. The reduced absorption coefficient photodiode ($\alpha$=0.2 $\mu m^{-1}$) reduces the number of carriers which are photo-generated in the first few micrometers of the photodiode such that the maximum of the photocurrent, which occurs at the beginning of a photodiode (around x=0 µm), is greatly reduced in the reduced absorption coefficient photodiode when compared to the prior art photodiode ($\alpha$=0.1 $\mu m^{-1}$).

Referring now to FIG. 8, the reduction in the maximum of the photocurrent in the beginning region (around x=0 µm) of the reduced absorption coefficient waveguide photodiode ($\alpha$=0.2 $\mu m^{-1}$) has an even greater effect on the dissipated power in the beginning region of the photodiode because dissipated power is proportional to the square of the photocurrent. Therefore, a reduction in the maximum level of the photocurrent (FIG. 7) has an exponential effect on the dissipated power (FIG. 8); therefore, lowering the photocurrent even slightly results in a significantly lower amount of heat being dissipated in the first few micrometers of the photodiode. This in turn reduces the possibility of thermal failure and electric field collapse of the photodiode.

Referring back to FIG. 6, it is desirable to produce as much photocurrent as possible from an input light signal 67. Efficiency of a photodiode 60 is a measure of how much of the input light signal 67 is absorbed. The lower the value of the absorption coefficient, the longer the length the photodiode 60 must be to absorb all of the input light signal 67. As shown in FIG. 7, for a typical prior art photodiode ($\alpha$=1.0 $\mu m^{-1}$), only an approximately six micrometer (6 µm long photodiode is required to absorb substantially all the input light signal. In comparison, a reduced absorption coefficient photodiode ($\alpha$=0.2 $\mu m^{-1}$) will require a longer length photodiode in order to absorb substantially all the input light signal. The length of the reduced absorption coefficient photodiode 60 is selected so that substantially all of the input light signal 67 is absorbed by the photodiode 60. For example, a reduced absorption coefficient photodiode 60 having an absorption layer with an absorption coefficient of 0.2 $\mu m^{-1}$ will require a 20–30 µm long absorption layer 62 to absorb substantially all the input light signal 67.

The longer absorption region 62 of the reduced absorption coefficient photodiode 60 in accordance with the present invention will add some unwanted capacitance to the photodiode 60. However, calculations have shown that the capacitance of a 20–30 µm long absorption region 62 will not add a significant enough amount of capacitance to the photodiode 60 to be the limiting factor in the photodiode design for a frequency response up to at least 30 GHz. To keep the capacitance of the photodiode 60 at a manageable level, it is preferred that the absorption coefficient of the reduced absorption coefficient photodiode 60 be selected so that the length, x, of the absorption region 62 is no more than about 30 µm.

By reducing the absorption coefficient of the absorption layer of the typical prior art photodiode, the present invention provides for lower absorption of an input light signal in the beginning region of the photodiode as well as a more linear response over the length of the photodiode and does so in a device which is relatively easy to fabricate and does not require adding termination impedance to the photodiode.

It will be appreciated by persons skilled in the art that the present invention is not limited to what has been shown and described hereinabove. The scope of the invention is limited solely by the claims which follow.

I claim as my invention:

1. A photodiode responsive to an input light signal comprising:

an absorption layer which is fabricated of a preselected material having an absorption coefficient less than the absorption coefficient of InGaAs when measured at a wavelength of 1.55 µm;

first and second cladding layer disposed on opposite sides of said absorption layer leaving exposed a side of the absorption layer;

positively and negatively polarized contact layers disposed on the first and second cladding layers respectively, said input light signal directed into the exposed side of said absorption layer and propagates in said absorption layer, said absorption layer absorbing said input light signal and photo-generating therefrom carriers, said contact layers collecting said carriers and generating therefrom photocurrent.

2. A photodiode as in claim 1, wherein said preselected material has an absorption coefficient which is less than approximately 0.4 $m^{-1}$.

3. A photodiode as in claim 1, wherein said absorption coefficient is about approximately 0.2 $\mu m^{-1}$.

4. A photodiode as in claim 1, wherein said preselected material comprises Aluminum (Al).

5. A photodiode as in claim 4, wherein said absorption coefficient of said preselected material is less than 0.8 $\mu m^{-1}$.

6. A photodiode as in claim 4, wherein said preselected material is InGaAlAs.

7. A photodiode as in claim 6, wherein aluminum comprises between 1% and 2% of said InGaAlAs material.

8. A photodiode as in claim 1, wherein said preselected material comprises Phosphorous (P).

9. A photodiode as in claim 8, wherein said absorption coefficient of said preselected material is less than 0.8 $\mu m^{-1}$.

10. A photodiode as in claim 9, wherein said preselected material is InGaAsP.

11. A photodiode as in claim 10, wherein said absorption coefficient of said InGaP is less than approximately 0.6 $\mu m^{-1}$ when measure at the wavelength of 1.55 $\mu m$.

12. A photodiode as in claim 1, wherein said photodiode has a length which is selected so that substantially all of the input light signal is absorbed by the absorption layer.

13. A photodiode disposed in an RF optical communications link and responsive to an input light signal, the photodiode comprising:

an absorption layer which is fabricated of a preselected material having an absorption coefficient less than the absorption coefficient of InGaAs when measured at a wavelength of 1.55 $\mu m$;

first and second cladding layer disposed on opposite sides of said absorption layer leaving exposed a side of the absorption layer; and, positively and negatively polarized contact layers disposed on the first and second cladding layers respectively, said input light signal directed into the exposed side of said absorption layer and propagates in said absorption layer, said absorption layer absorbing said input light signal and photo-generating therefrom carriers, said contact layers collecting said carriers and generating therefrom photocurrent.

14. A photodiode as in claim 13, wherein said preselected material has an absorption coefficient which is less than approximately 0.4 $\mu m^{-1}$.

15. A photodiode as in claim 13, wherein said absorption coefficient is about approximately 0.2 $\mu m^{-1}$.

16. A photodiode as in claim 13, wherein said preselected material comprises Aluminum (Al).

17. A photodiode as in claim 16, wherein said absorption coefficient of said preselected material is less than 0.8 $\mu m^{-1}$.

18. A photodiode as in claim 16, wherein said preselected material is InGaAlAs.

19. A photodiode as in claim 18, wherein aluminum comprises between 1% and 2% of said InGaAlAs material.

20. A photodiode as in claim 13, wherein said preselected material comprises Phosphide (P).

21. A photodiode as in claim 20, wherein said absorption coefficient of said preselected material is less than 0.8 $\mu m^{-1}$.

22. A photodiode as in claim 20, wherein said preselected material is InGaAsP.

23. A photodiode as in claim 22, wherein said absorption coefficient of said InGaAsP is less than approximately 0.6 $\mu m^{-1}$ when measure at the wavelength of 1.55 $\mu m$.

24. A photodiode as in claim 13, wherein said photodiode has a length which is selected so that substantially all of the input light signal is absorbed by the absorption layer.

\* \* \* \* \*